United States Patent
Cheng et al.

(10) Patent No.: US 11,403,242 B2
(45) Date of Patent: *Aug. 2, 2022

(54) CONTROL METHOD OF MULTIPLE MEMORY DEVICES AND ASSOCIATED MEMORY SYSTEM

(71) Applicant: Realtek Semiconductor Corp., HsinChu (TW)

(72) Inventors: Ching-Sheng Cheng, HsinChu (TW); Wen-Wei Lin, HsinChu (TW); Kuan-Chia Huang, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/169,520

(22) Filed: Feb. 7, 2021

(65) Prior Publication Data

US 2021/0271616 A1    Sep. 2, 2021

(30) Foreign Application Priority Data

Feb. 27, 2020 (TW) ................................. 109106478

(51) Int. Cl.
*G06F 13/16* (2006.01)
*G11C 7/10* (2006.01)
*G11C 8/18* (2006.01)
*G11C 11/4076* (2006.01)

(52) U.S. Cl.
CPC ........ *G06F 13/1689* (2013.01); *G06F 13/161* (2013.01); *G06F 13/1647* (2013.01); *G11C 7/1042* (2013.01); *G11C 8/18* (2013.01); *G11C 11/4076* (2013.01)

(58) Field of Classification Search
None
See application file for complete search history.

(56) References Cited

U.S. PATENT DOCUMENTS

| 8,447,917 B2* | 5/2013 | Chen ................... G06F 13/1684 |
| | | 711/E12.001 |
| 9,093,160 B1* | 7/2015 | Ellis ........................ G11C 16/32 |
| 2010/0199025 A1* | 8/2010 | Nanjou ............... G06F 12/0246 |
| | | 711/158 |
| 2012/0226852 A1* | 9/2012 | Chen ....................... G06F 12/00 |
| | | 711/E12.001 |

(Continued)

FOREIGN PATENT DOCUMENTS

| TW | 201324336 A1 | 6/2013 |
| TW | 201600966 A | 1/2016 |

*Primary Examiner* — Yaima Rigol
(74) *Attorney, Agent, or Firm* — Winston Hsu

(57) ABSTRACT

The present invention provides a control method of multiple memory devices, wherein the multiple devices comprise a first memory device and a second memory device, and the control method includes the steps of: determining a first operation timing and a second operation timing according to at least a first command signal that a first memory controller needs to send to the first memory device; controlling the first memory controller to send the first command signal to the first memory device at the first operation timing; and controlling the second memory controller to send the second command signal to the second memory device at the second operation timing.

14 Claims, 5 Drawing Sheets

(56) References Cited

U.S. PATENT DOCUMENTS

| | | | |
|---|---|---|---|
| 2015/0089164 A1* | 3/2015 | Ware | G11C 7/10 |
| | | | 711/149 |
| 2015/0221349 A1* | 8/2015 | Jeon | G06F 12/0246 |
| | | | 711/149 |
| 2018/0090185 A1* | 3/2018 | Hossain | G11C 7/1012 |
| 2018/0196620 A1* | 7/2018 | Kim | G06F 3/0659 |
| 2019/0138246 A1* | 5/2019 | Lee | G06F 13/16 |
| 2020/0159434 A1* | 5/2020 | Walker | G06F 3/0604 |
| 2021/0026789 A1 | 1/2021 | Cheng et al. | |

\* cited by examiner

CONTROL METHOD OF MULTIPLE MEMORY DEVICES AND ASSOCIATED MEMORY SYSTEM

BACKGROUND OF THE INVENTION

1. Field of the Invention

The present invention relates to a control method of multiple memory devices and associated memory system.

2. Description of the Prior Art

In the design of modern electronic systems, the double data rate (DDR) Dynamic Random Access Memory (DRAM) system is often divided into two parts: a memory control logic and a physical layer. A DDR physical interface (DFI) is defined between the memory controller logic and the physical layer to implement standard interconnection. In a word, the DFI interface aims at providing a common interface between the memory control logic and the physical layer, to convert command signal and data signal, transmitted from the memory controller to the memory device, into a specification defined in the memory device (such as a dual in-line memory model, DIMM). Similarly, data signal transmitted from the memory device to the memory controller can be converted to a specification of the memory controller through the DFI interface.

The conventional memory controller can be connected with multiple memory devices (such as the Double-Data-Rate Fourth Generation Synchronous Dynamic Random Access Memory, DDR4). Each time the memory controller transmits a command signal (such as read, write, active, pre-charge, auto-refresh, self-refresh, etc.) to each memory device through the DFI interface. Therefore, every memory device is operated at the same time. For example, a memory controller is connected with three memory devices. The memory controller will receive three times the size of the data in the case of the shared command interface when the memory controller reads only one memory device (For the DDR4 to access, such as read/write, 16-bit data each time, 16 bits*3=48 bits data size is required, therefore increasing the bandwidth). For separately accessing a single memory device, an additional command interface is added for data shunt method, to reduce the required data size (only 16 bit*1=16 bit). However, the additional command interface means that the memory controller needs additional pins to control the memory device independently, resulting in limitations on the board layout and increasing cost.

SUMMARY OF THE INVENTION

It is therefore an objective to provide a method of memory time division control and a related device, which has a better bandwidth utilization mechanism, to solve the above problem.

According to one embodiment of the present invention, a control method of multiple memory devices is disclosed, wherein the multiple devices comprise a first memory device and a second memory device, and the control method comprises: determining a first operation timing and a second operation timing according to at least a first command signal that a first memory controller needs to send to the first memory device; controlling the first memory controller to send the first command signal to the first memory device at the first operation timing; and controlling the second memory controller to send the second command signal to the second memory device at the second operation timing.

According to another embodiment of the present invention, a memory system is disclosed, wherein the memory system comprises a first memory device, a second memory device, a first memory controller, a second memory controller and a timing management device. The timing management device is configured to determine a first operation timing and a second operation timing according to at least a first command signal that the first memory controller needs to send to the first memory device, in order to control the first memory controller to send the first command signal to the first memory device at the first operation timing, and to control the second memory controller to send the second command signal to the second memory device at the second operation timing.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
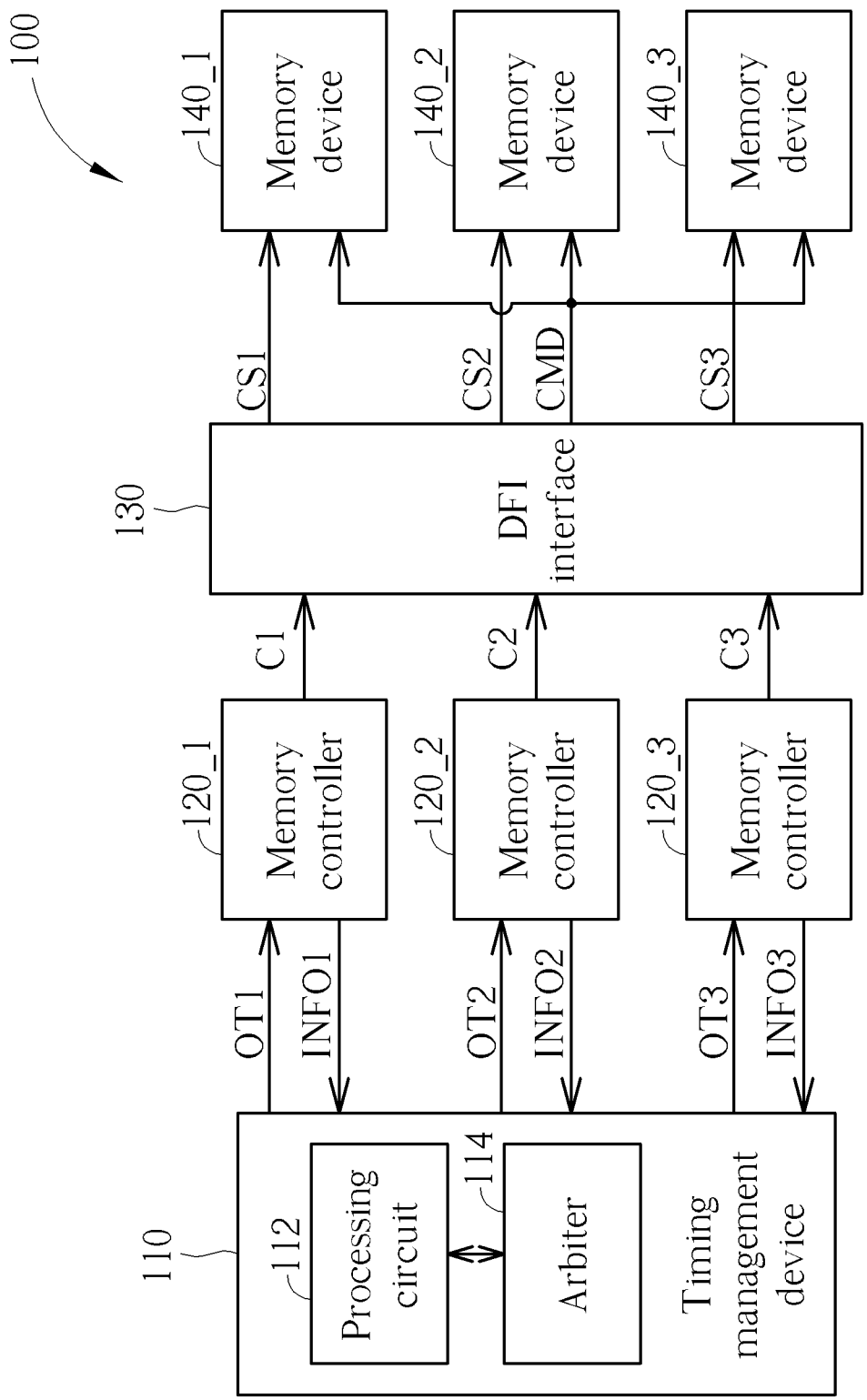
FIG. 1 is a diagram illustrating a memory system according to one embodiment of the present invention.

FIG. 1 is a diagram illustrating a memory system 100 according to one embodiment of the present invention. The memory system 100 includes a timing management device 110, a plurality of memory controllers (in this embodiment, there are three memory controllers 120_1-1-20_3), a DFI interface 130 and a plurality of memory devices (in this embodiment, there are three memory devices 140_1-140_3). The timing management device 110 is used for configuring different operation timings for the memory controllers 120_1-120_3 according to a clock signal generated by a clock generator (not shown in figure). For example, a processing circuit 112 within the timing management device 110 assigns a first operation timing OT1 to the memory controller 120_1, a second operation timing OT2 to the memory controller 120_2, and a third operation timing OT3 to the memory controller 120_3, wherein a length or a time interval of each operation timing is configured according to a period of the clock signal. Thus, the memory controller 120_1 transmits a command signal C1 at the first operation timing OT1, the memory controller 120_2 transmits a command signal C2 at the second operation timing OT2, and the memory controller 120_3 transmits a command signal C3 at the third operation timing OT3, wherein the first operation timing OT1, the second operation timing OT2 and the third operation timing OT3 are not overlapped. In addition, after the DFI interface 130 receives the command signal C1, command signal C2 or command signal C3 (e.g. read, write, active, pre-charge, auto-refresh, self-refresh, etc.), the DFI interface 130 converts the command signal to a high level or low level chip select signal (CS), row address strobe (RAS), column address strobe (CAS) or write enable signal (WE) according to an operation indicated by the command signal, so as to transmit to the memory devices 140_1-140_3. Note that, the memory controllers 120_1-120_3 share the same command signal line CMD and address signal line (not shown in figure), but are deployed with independent chip select signal lines, such that the chip select signal could be transmitted with time-sharing mechanism. In a word, a chip select signal CS1 of the memory controller 120_1 is transmitted to the memory device 140_1 at the first operation timing OT1, so that the memory controller 120_1 can access the memory device 140_1 at the first operation timing OT1. Similarly, a chip select signal CS2 of the memory controller 120_2 is transmitted to the memory device 140_2 at the second operation timing OT2, so that the memory controller 120_2 can access the memory device 140_2 at the second operation timing OT2. On the other hand, the row address strobe, the column address strobe or the write enable signal of one of the memory controller 120_1-120_3 is transmitted to the memory devices 140_1-140_3 at the same time, and thus a common DFI interface 130 is realized in the present disclosure.

According to the timing control of the memory controllers 120_1-120_3, the timing management device 110 divides the time sequence on the command interface into multiple intervals, for the command signal of the memory controller is transmitted only at the configured interval. With such manner, multiple memory controllers 120_1-120_3 can share the same command signal line and address signal line, to reduce a number of pins of the DFI interface 130. In addition, every memory controller 120_1-120_3 is deployed with independent chip select signal line corresponding to a memory device 140_1-140_3, and thus every memory controller 120_1-120_3 performs control operation only at its operation times and then accesses the memory device with the corresponding chip select signal CS1/CS2/CS3.

Although the memory system 100 shown in FIG. 1 can effectively use the pins on the DFI interface 130 by sharing a set of command signal lines CMD and using time-division transmission, the use of time-division transmission will cause the command signal delay, thus affecting the overall bandwidth of the memory system 100. Therefore, in order to reduce the impact of bandwidth reduction caused by time-division transmission, in this embodiment, an arbiter 114 is additionally provided in the timing management device 110 to allocate the intervals that the memory controller 120_1-120_3 can use while minimizing bandwidth loss.

Figure 2:
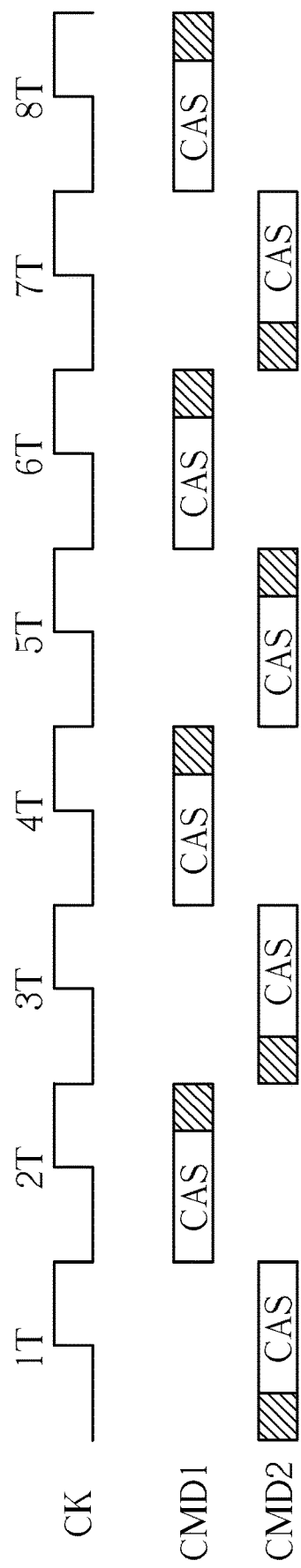
FIG. 2 is a timing diagram of the command signals according to one embodiment of the present invention.

In order to facilitate the following description, only the memory controllers 120_1 and 120_2 shown in FIG. 1 are used for the following description, that is, it is assumed that the timing management device 110 only needs to divide the time sequence into intervals used by two memory controllers 120_1 and 120_2. In one embodiment, it is assumed that the bandwidth of the memory controller 120_1 is higher than the bandwidth of the memory controller 120_2. For example, the memory controller 120_1 may have a 32-bit bandwidth, and the memory controller 120_2 may have a 16-bit bandwidth. In the operation of the timing management device 110, the arbiter 114 receives first information INFO1 and second information INFO2 from the memory controllers 120_1 and 120_2, respectively, where the first information INFO1 includes the information the command signal C1 that the memory controller 120_1 needs to send to the memory device 140_1, and the second information INFO2 includes the information the command signal C2 that the memory controller 120_2 needs to send to the memory device 140_2. Next, the arbiter 114 determines whether the command signals C1 and C2 are access command(s) or non-access command(s) based on the first information INFO1 and the second information INFO2, wherein the access command includes a read command and a write command, and the non-access command includes an active command, a pre-charge command, an auto refresh command and a self-refresh command. In an example, if the command signal C1 and the command signal C2 are both access commands, the arbiter 114 will notify the processing circuit 112 to determine the time-averaged and alternately allocated first operation timing OT1 and the second operation timing OT2. Taking FIG. 2 as an example, a symbol "CK" shown in FIG. 2 is the clock signal in the memory system 100, a symbol "CMD1 corresponds to multiple command signals (including the command signal C1) from the memory controller 120_1, and the symbol "CMD2" corresponds to multiple command signals (including command signal C2) from the memory controller 120_2, and because the access commands and the non-access commands have different performances in row address strobe (RAS) and column address strobe (CAS), the CAS is used to represent the access command, and the RAS is used to represent the non-access command shown in FIG. 2. As shown in FIG. 2, since multiple command signals CMD1 and multiple command signals CMD2 are access commands, the command signals CMD1 are transmitted in the intervals 2T, 4T, 6T and 8T, and the command signals CMD2 are transmitted in the intervals 1T, 3T, 5T and 7T, for interlaced transmission.

Figure 3:
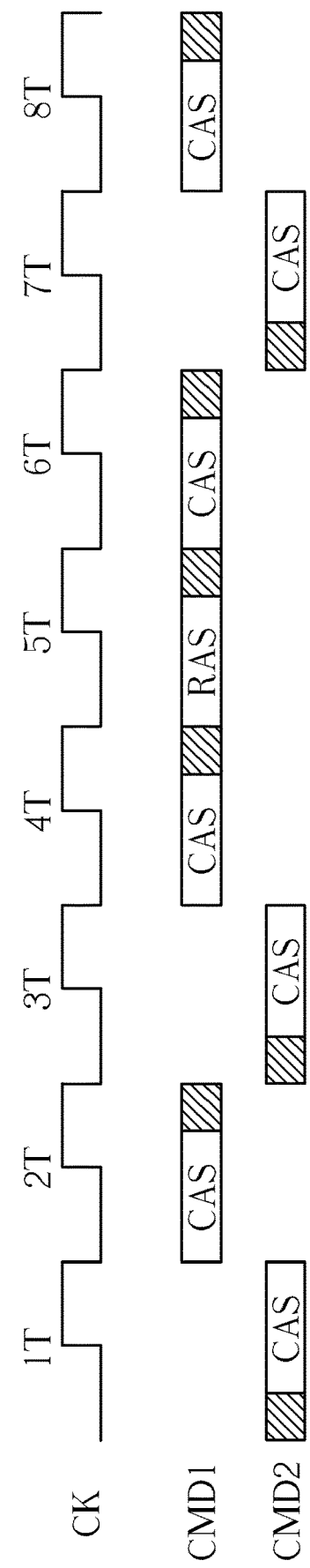
FIG. 3 is a timing diagram of the command signals according to another embodiment of the present invention.

In another example, if the command signal C1 belongs to a non-access command, and the command signal C2 belongs to an access command, the non-access command will be regarded as the main factor to reduce the bandwidth. Therefore, the arbiter 114 notifies the processing circuit 112 to determine that the first operation timing OT1 has priority over the second operation timing OT2, so that the time when the command signal C1 is transmitted to the first memory device 140_1 has priority over the time when the command signal C2 is transmitted to the second memory device 140_2. Taking FIG. 3 as example, the CAS is used to represent the access command, and the RAS is used to represent the non-access command. As shown in FIG. 3, the processing circuit 112 can control the memory controllers 120_1 and 120_2 so that the multiple command signals CMD1 including the command signal C1 are transmitted in the intervals 2T, 4T, 5T, 6T and 8T, and the multiple command signals CMD2 including the command signal C2 are transmitted in the intervals 1T, 3T and 7T. That is, the command signals CMD1 having the non-access command can interrupt the transmission of the access command in the command signals CMD2, so that the first memory controller 120_1 can send the command signals including the non-access command in three consecutive intervals (i.e., three clock cycles). In the embodiment shown in FIG. 3, if the first operation timing OT1 and the second operation timing OT2 are not adjusted according to the access command and the non-access command, the memory controller 120_1 with a larger bandwidth will cause serious bandwidth loss because it has to send the non-access command.

Therefore, by using the interval "5T" in which the command signal CMD2 was originally sent to transmit the non-access command of the memory controller 120_1, the bandwidth loss can be borne by the memory controller 120_2 with a smaller bandwidth, so the overall bandwidth loss can be effectively reduced.

Figure 4:
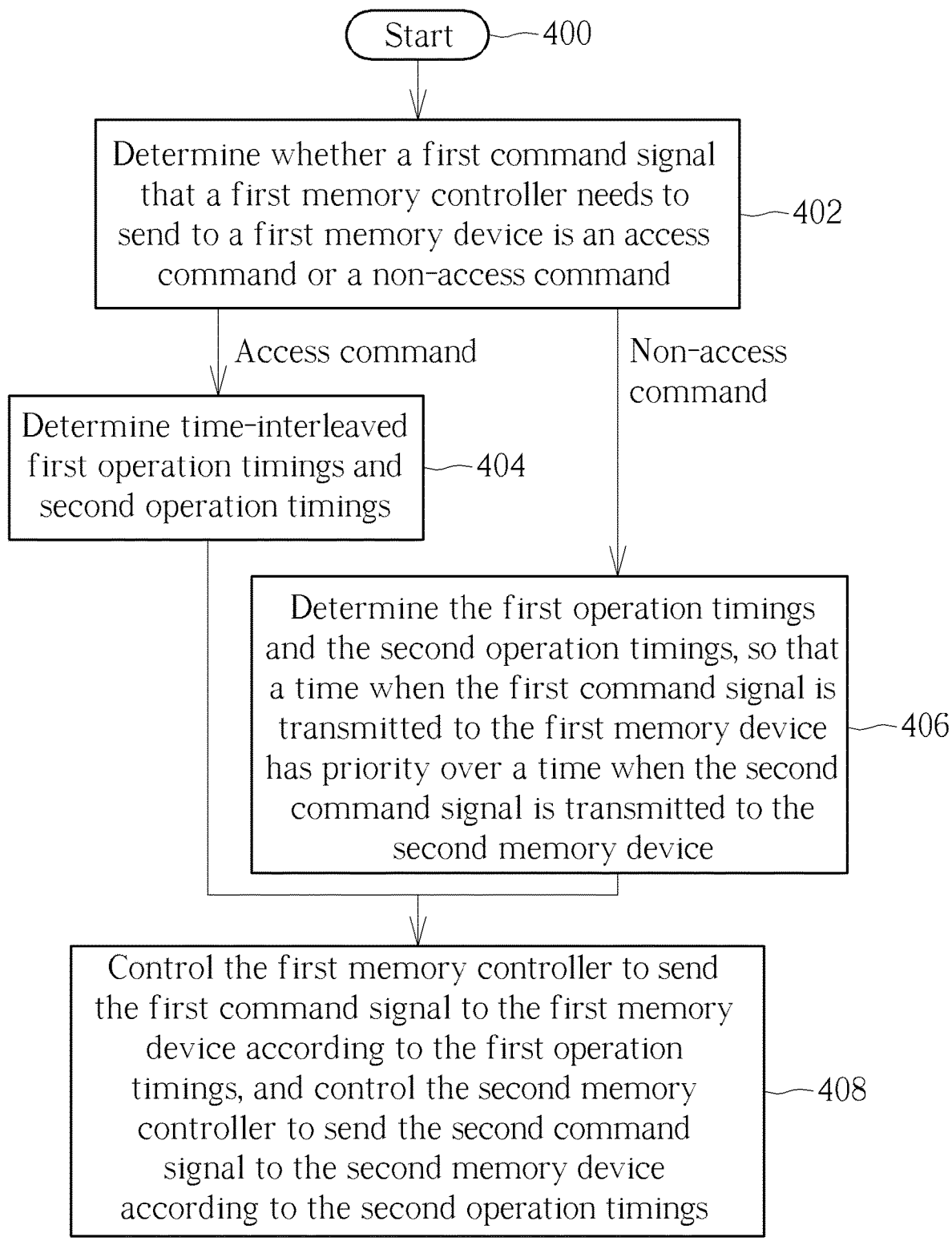
FIG. 4 is a flowchart of a control method for multiple memory devices according to one embodiment of the present invention.

FIG. 4 is a flowchart of a control method for multiple memory devices according to one embodiment of the present invention. With reference to the content described in the above embodiment, the flow of the control method is described as follows.

Step 400: the flow starts.

Step 402: determine whether a first command signal that a first memory controller needs to send to a first memory device is an access command or a non-access command. If the first command signal is the access command, the flow enters Step 404; if the first command signal is the non-access command, the flow enters Step 406.

Step 404: determine time-interleaved first operation timings and second operation timings.

Step 406: determine the first operation timings and the second operation timings, so that a time when the first command signal is transmitted to the first memory device has priority over a time when the second command signal is transmitted to the second memory device.

Step 408: control the first memory controller to send the first command signal to the first memory device according to the first operation timings, and control the second memory controller to send the second command signal to the second memory device according to the second operation timings.

It is noted that although the embodiments in FIG. 2 and FIG. 3 only use the memory controllers 120_1 and 120_2 for illustration, a person skilled in the art should be able to understand the application in the three memory controllers 120_1-120_3 or more memory controllers, that is, the timing management device 110 will also receive the third information INFO3 from the memory controller 120_3 for determining the first operation timing OT1, the second operation timing OT2 and the third operation timing OT3 of the memory controllers 120_1-120_3, respectively.

Figure 5:
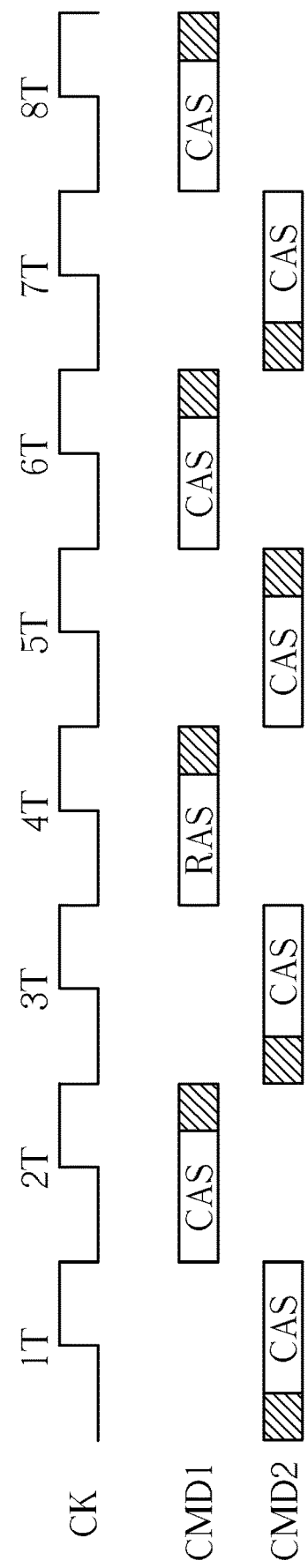
FIG. 5 is a timing diagram of the command signals according to another embodiment of the present invention.

In the embodiments shown in FIGS. 2-4 above, the timing management device 110 is mainly based on whether the command signal C1 that the memory controller 120_1 needs to send to the memory device 140_1 is an access command or a non-access command for generating the first operation timing OT1 and the second operation timing OT2. However, the above determination mechanism can also refer to the busyness of the memory controllers 120_1 and 120_2 simultaneously. Specifically, assuming that the bandwidth of the memory controller 120_1 is higher than the bandwidth of the memory controller 120_2, for example, the memory controller 120_1 may have a 32-bit bandwidth, and the memory controller 120_2 may have a 16-bit bandwidth. In the operation of the timing management device 110, the arbiter 114 receives first information INFO1 and second information INFO2 from the memory controllers 120_1 and 120_2, respectively, where the first information INFO1 includes the information the command signal C1 that the memory controller 120_1 needs to send to the memory device 140_1 and a current busyness, and the second information INFO2 includes the information the command signal C2 that the memory controller 120_2 needs to send to the memory device 140_2 and a current busyness. In one embodiment, a degree of busyness may be the number of command signals to be processed by the memory controller, and the greater the number of command signals to be processed, the higher the degree of busyness. Next, the arbiter 114 determines whether the command signals C1 and C2 are access command(s) or non-access command(s) based on the first information INFO1 and the second information INFO2, wherein the access command includes a read command and a write command, and the non-access command includes an active command, a pre-charge command, an auto refresh command and a self-refresh command. In an example, if the command signal C1 and the command signal C2 are both access commands, the arbiter 114 will notify the processing circuit 112 to determine the time-averaged and alternately allocated first operation timing OT1 and the second operation timing OT2 as shown in FIG. 2. In another embodiment, if the command signal C1 belongs to the non-access command, the command signal C2 belongs to the access command, and the degree of busyness of the memory controller 120_2 is higher than the degree of busyness of the memory controller 120_1 but the difference does not meet a preset condition (for example, the busyness difference is within a range), or the degree of busyness of the memory controller 120_1 is higher than the degree of busyness of the memory controller 120_2 while the busyness difference meets a preset condition, the arbiter 114 determines that the first operation timing OT1 is prior to the second operation timing OT2, so that the transmission time of the command signal C1 to the memory device 140_1 has priority over the transmission time of the command signal C2 to the memory device 140_2. For example, the non-access command in the command signal CMD1 shown in FIG. 3 can interrupt the transmission of the access command in the command signal CMD2, so that the first memory controller 120_1 can transmit multiple command signals including the non-access command in three consecutive intervals (i.e., three clock cycles). In another embodiment, if the command signal C1 belongs to the non-access command, the command signal C2 belongs to the access command, and the degree of busyness of the memory controller 120_2 is higher than the degree of busyness of the memory controller 120_1 while the busyness difference meets the preset condition (for example, the busyness difference is out of range), the arbiter 114 will notify the processing circuit 112 to determine the time-averaged and alternately allocated first operation timing OT1 and the second operation timing OT2 as shown in FIG. 5. In FIG. 5, although the memory controller 120_1 uses the interval "4T" to transmit the non-access command that causes a large bandwidth loss, but in order to avoid affecting the busy memory controller 120_2, the time-interleaved first operation timing OT1 and the second operation timing OT2 are still used.

Figure 6:
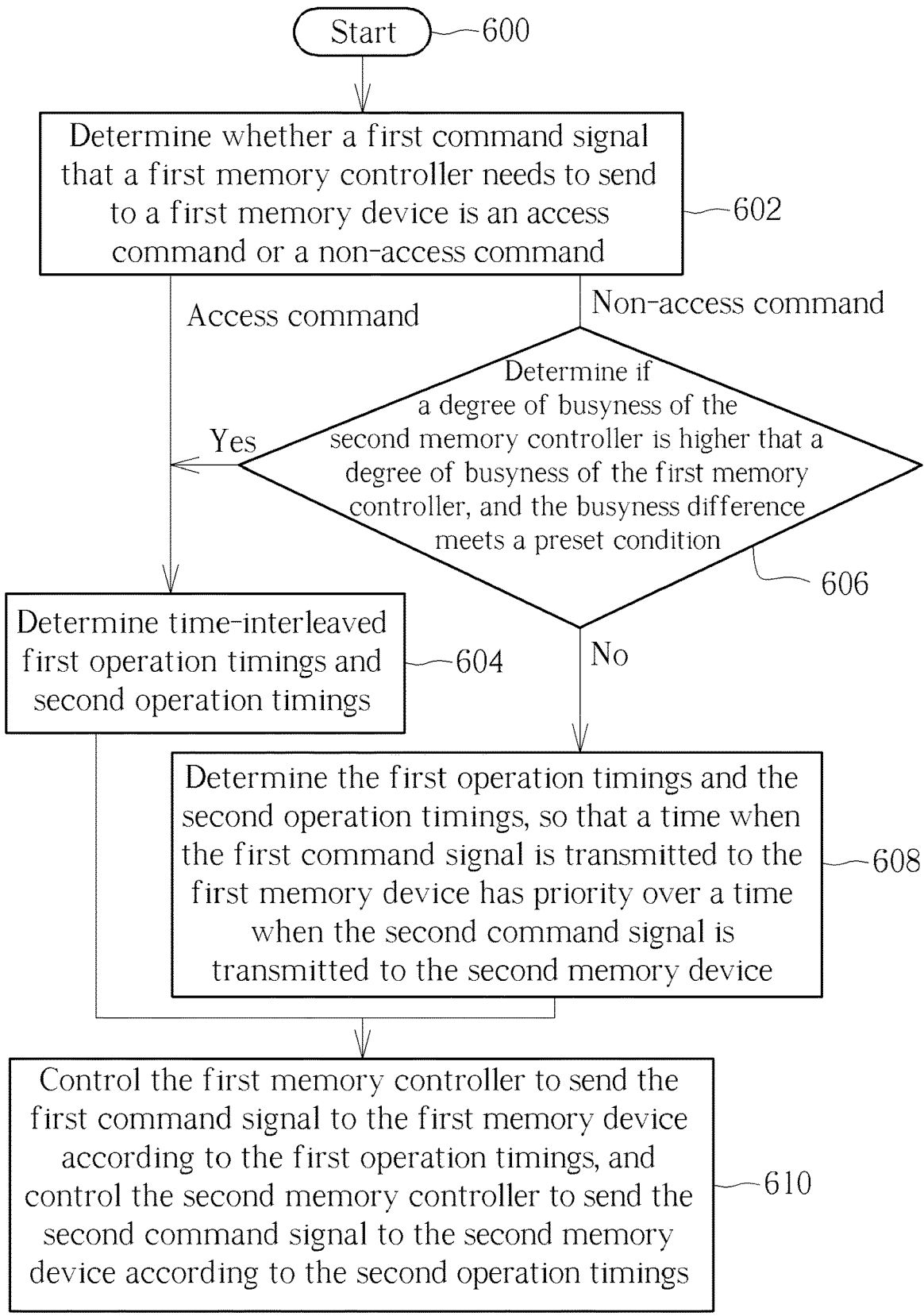
FIG. 6 is a flowchart of a control method for multiple memory devices according to another embodiment of the present invention.

FIG. 6 is a flowchart of a control method for multiple memory devices according to another embodiment of the present invention. With reference to the content described in the above embodiment, the flow of the control method is described as follows.

Step 600: the flow starts.

Step 602: determine whether a first command signal that a first memory controller needs to send to a first memory device is an access command or a non-access command. If the first command signal is the access command, the flow enters Step 604; if the first command signal is the non-access command, the flow enters Step 606.

Step 604: determine time-interleaved first operation timings and second operation timings.

Step 606: determine if a degree of busyness of the second memory controller is higher that a degree of busyness of the first memory controller, and the busyness difference meets a preset condition. If yes, the flow enters Step 604; and if not, the flow enters Step 608.

Step 608: determine the first operation timings and the second operation timings, so that a time when the first command signal is transmitted to the first memory device has priority over a time when the second command signal is transmitted to the second memory device.

Step 610: control the first memory controller to send the first command signal to the first memory device according to the first operation timings, and control the second memory controller to send the second command signal to the second memory device according to the second operation timings.

Briefly summarized, in the control method for multiple memory devices and related memory system of the present invention, a time-division control is used so that the memory system can effectively reduce the number of pins of the DFI interface by sharing a set of command signals and using time-division transmission. In addition, in order to reduce the impact of the aforementioned time-division control on the bandwidth, one embodiment additionally proposes a mechanism that allows the non-access command of the first memory controller with higher bandwidth to interrupt the access command of the second memory controller with lower bandwidth, so as to reduce the overall bandwidth loss as much as possible.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A control method of multiple memory devices, wherein the multiple devices comprise a first memory device and a second memory device, and the control method comprises:
   determining a first operation timing and a second operation timing according to at least a first command signal that a first memory controller needs to send to the first memory device;
   controlling the first memory controller to send the first command signal to the first memory device at the first operation timing; and
   controlling a second memory controller to send a second command signal to the second memory device at the second operation timing;
   wherein a bandwidth of the first memory controller is higher than a bandwidth of the second memory controller, and the step of determining the first operation timing and the second operation timing comprises:
   in response to the first command signal and the second command signal both being access commands, determining the first operation timing and the second operation timing that are time interleaved; and
   in response to the first command signal being a non-access command and the second command signal being the access command, determining the first operation timing and the second operation timing, so that a time when the first command signal is transmitted to the first memory device has priority over a time when the second command signal is transmitted to the second memory device.

2. The control method of claim 1, wherein the step of determining the first operation timing and the second operation timing comprises:
   in response to the first command signal being the non-access command and the second command signal being the access command, determining the first operation timing and the second operation timing, so that the first memory controller sends multiple command signals including the non-access command in three consecutive intervals.

3. The control method of claim 1, wherein the step of determining the first operation timing and the second operation timing comprises:
   determining the first operation timing and the second operation timing according to at least the first command signal that the first memory controller needs to send to the first memory device and degrees of busyness of the first memory controller and the second memory controller.

4. A control method of multiple memory devices, wherein the multiple devices comprise a first memory device and a second memory device, and the control method comprises:
   determining a first operation timing and a second operation timing according to at least a first command signal that a first memory controller needs to send to the first memory device;
   controlling the first memory controller to send the first command signal to the first memory device at the first operation timing; and
   controlling a second memory controller to send a second command signal to the second memory device at the second operation timing;
   wherein the step of determining the first operation timing and the second operation timing comprises:
   determining the first operation timing and the second operation timing according to at least the first command signal that the first memory controller needs to send to the first memory device and degrees of busyness of the first memory controller and the second memory controller; and
   in response to the first command signal being the non-access command, the second command signal being the access command, a degree of busyness of the first memory controller being higher that a degree of busyness of the second memory controller, and a busyness difference meeting a preset condition, determining the first operation timing and the second operation timing, so that a time when the first command signal is transmitted to the first memory device has priority over a time when the second command signal is transmitted to the second memory device.

5. The control method of claim 4, wherein the step of determining the first operation timing and the second operation timing comprises:
   in response to the first command signal being the non-access command, the second command signal being the access command, the degree of busyness of the first memory controller being higher that the degree of busyness of the second memory controller, and the busyness difference meeting the preset condition, determining the first operation timing and the second operation timing, so that the first memory controller sends multiple command signals including the non-access command in three consecutive intervals.

6. The control method of claim 4, wherein a bandwidth of the first memory controller is higher than a bandwidth of the second memory controller, and the step of determining the first operation timing and the second operation timing comprises:
   in response to the first command signal being the non-access command, the second command signal being the access command, a degree of busyness of the second memory controller being higher that a degree of busyness of the first memory controller, and a busyness difference meeting a preset condition, determining the first operation timing and the second operation timing that are time interleaved; and in response to the first command signal being the non-access command, the second command signal being the access command, the degree of busyness of the second memory controller being higher that the degree of busyness of the first memory controller, and the busyness difference not meeting the preset condition, determining the first operation timing and the second operation timing, so that a time when the first command signal is transmitted to the first memory device has priority over a time when the second command signal is transmitted to the second memory device.

7. The control method of claim 6, wherein the step of determining the first operation timing and the second operation timing comprises:
in response to the first command signal being the non-access command, the second command signal being the access command, the degree of busyness of the second memory controller being higher that the degree of busyness of the first memory controller, and the busyness difference not meeting the preset condition, determining the first operation timing and the second operation timing, so that the first memory controller sends multiple command signals including the non-access command in three consecutive intervals.

8. A memory system, comprising:
a first memory device and a second memory device;
a first memory controller and a second memory controller, configured to access the first memory device and the second memory device, respectively;
a timing management device, coupled to the first memory controller and the second memory controller, configured to determine a first operation timing and a second operation timing according to at least a first command signal that the first memory controller needs to send to the first memory device, in order to control the first memory controller to send the first command signal to the first memory device at the first operation timing, and to control the second memory controller to send a second command signal to the second memory device at the second operation timing;
wherein a bandwidth of the first memory controller is higher than a bandwidth of the second memory controller, and in response to the first command signal and the second command signal both being access commands, the timing management device determines the first operation timing and the second operation timing that are time interleaved; and in response to the first command signal being a non-access command and the second command signal being the access command, the timing management device determines the first operation timing and the second operation timing, so that a time when the first command signal is transmitted to the first memory device has priority over a time when the second command signal is transmitted to the second memory device.

9. The memory system of claim 8, wherein in response to the first command signal being the non-access command and the second command signal is the access command, the timing management device determines the first operation timing and the second operation timing, so that the first memory controller sends multiple command signals including the non-access command in three consecutive intervals.

10. The memory system of claim 8, wherein the timing management device determines the first operation timing and the second operation timing according to at least the first command signal that the first memory controller needs to send to the first memory device and degrees of busyness of the first memory controller and the second memory controller.

11. The memory system of claim 10, wherein in response to the first command signal being the non-access command, the second command signal being the access command, a degree of busyness of the first memory controller being higher that a degree of busyness of the second memory controller, and a busyness difference meeting a preset condition, the timing management device determines the first operation timing and the second operation timing, so that a time when the first command signal is transmitted to the first memory device has priority over a time when the second command signal is transmitted to the second memory device.

12. The memory system of claim 11, wherein in response to the first command signal being the non-access command, the second command signal being the access command, the degree of busyness of the first memory controller being higher that the degree of busyness of the second memory controller, and the busyness difference meeting the preset condition, the timing management device determines the first operation timing and the second operation timing, so that the first memory controller sends multiple command signals including the non-access command in three consecutive intervals.

13. The memory system of claim 10, wherein in response to the first command signal being the non-access command, the second command signal being the access command, a degree of busyness of the second memory controller being higher that a degree of busyness of the first memory controller, and a busyness difference meeting a preset condition, the timing management device determines the first operation timing and the second operation timing that are time interleaved; and in response to the first command signal being the non-access command, the second command signal being the access command, the degree of busyness of the second memory controller being higher that the degree of busyness of the first memory controller, and the busyness difference not meeting the preset condition, the timing management device determines the first operation timing and the second operation timing, so that a time when the first command signal is transmitted to the first memory device has priority over a time when the second command signal is transmitted to the second memory device.

14. The memory system of claim 13, wherein in response to the first command signal being the non-access command, the second command signal being the access command, the degree of busyness of the second memory controller being higher that the degree of busyness of the first memory controller, and the busyness difference not meeting the preset condition, the timing management device determines the first operation timing and the second operation timing, so that the first memory controller sends multiple command signals including the non-access command in three consecutive intervals.

* * * * *